(12) United States Patent
Pas et al.

(10) Patent No.: US 8,304,342 B2
(45) Date of Patent: Nov. 6, 2012

(54) SACRIFICIAL CMP ETCH STOP LAYER

(75) Inventors: Michael Francis Pas, Richardson, TX (US); Manfred Ramin, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/590,133

(22) Filed: Oct. 31, 2006

(65) Prior Publication Data

US 2008/0102634 A1 May 1, 2008

(51) Int. Cl.
*H01L 21/4763* (2006.01)

(52) U.S. Cl. ........ 438/651; 438/655; 438/664; 257/381; 257/413; 257/E21.438; 257/E21.23

(58) Field of Classification Search .................. 438/581, 438/583, 625, 629, 630, 633, 649, 650, 651, 438/652, 655, 656, 664, 682, 683, 684, 685, 438/689, 959; 257/382, 383, 384, 388, 413, 257/453, 454, 455, 456, 576, 754, 755, 757, 257/764, 766, 768, 769, 770, E21.23, E21.304, 257/E21.438, E21.439
See application file for complete search history.

(56) References Cited

U.S. PATENT DOCUMENTS

| 5,856,225 | A  | * | 1/1999  | Lee et al. ........... 438/291 |
|-----------|----|---|---------|--------------------------------|
| 6,376,320 | B1 | * | 4/2002  | Yu ..................... 438/303 |
| 6,770,523 | B1 |   | 8/2004  | Sahota et al.                  |
| 6,784,098 | B1 | * | 8/2004  | Lou ................... 438/645 |
| 6,805,614 | B2 |   | 10/2004 | Kwok                           |
| 6,929,992 | B1 | * | 8/2005  | Djomehri et al. ....... 438/199 |
| 6,936,480 | B2 |   | 8/2005  | Wollstein et al.               |
| 7,024,756 | B2 |   | 4/2006  | Le et al.                      |
| 7,029,376 | B1 |   | 4/2006  | Guthrie et al.                 |
| 7,029,944 | B1 |   | 4/2006  | Conley, Jr. et al.             |
| 7,173,312 | B2 | * | 2/2007  | Cabral et al. ........ 257/369 |
| 7,294,890 | B2 | * | 11/2007 | Lo et al. ............. 257/384 |
| 7,396,772 | B2 | * | 7/2008  | Lee et al. ............ 438/706 |
| 7,569,443 | B2 | * | 8/2009  | Kavalieros et al. ...... 438/183 |
| 2002/0065023 | A1 |   | 5/2002  | Kwok                        |
| 2003/0132487 | A1 | * | 7/2003  | Cabral et al. ...... 257/384 |
| 2004/0023490 | A1 |   | 2/2004  | Wollstein et al.            |
| 2004/0219780 | A1 | * | 11/2004 | Ohuchi ............... 438/637 |
| 2005/0024779 | A1 |   | 2/2005  | Le et al.                   |
| 2005/0042880 | A1 |   | 2/2005  | Kwok                        |
| 2006/0073623 | A1 |   | 4/2006  | Conley, Jr. et al.          |
| 2006/0109588 | A1 |   | 5/2006  | Le et al.                   |
| 2006/0148171 | A1 | * | 7/2006  | Lee .................... 438/257 |
| 2006/0199321 | A1 |   | 9/2006  | Lo et al.                   |
| 2006/0228885 | A1 | * | 10/2006 | Saito ................. 438/650 |
| 2006/0263961 | A1 | * | 11/2006 | Kittl et al. ........ 438/199 |
| 2008/0085590 | A1 | * | 4/2008  | Yao et al. ........... 438/583 |
| 2008/0136030 | A1 | * | 6/2008  | Chang et al. ....... 257/751 |

* cited by examiner

*Primary Examiner* — William D Coleman
*Assistant Examiner* — Su Kim
(74) *Attorney, Agent, or Firm* — Warren L. Franz; Wade J. Brady, III; Frederick J. Telecky, Jr.

(57) ABSTRACT

A chemical mechanical polishing (CMP) stop layer is implemented in a semiconductor fabrication process. The CMP stop layer, among other things, mitigates erosion of sidewall spacers during semiconductor fabrication and adverse effects associated therewith.

26 Claims, 12 Drawing Sheets

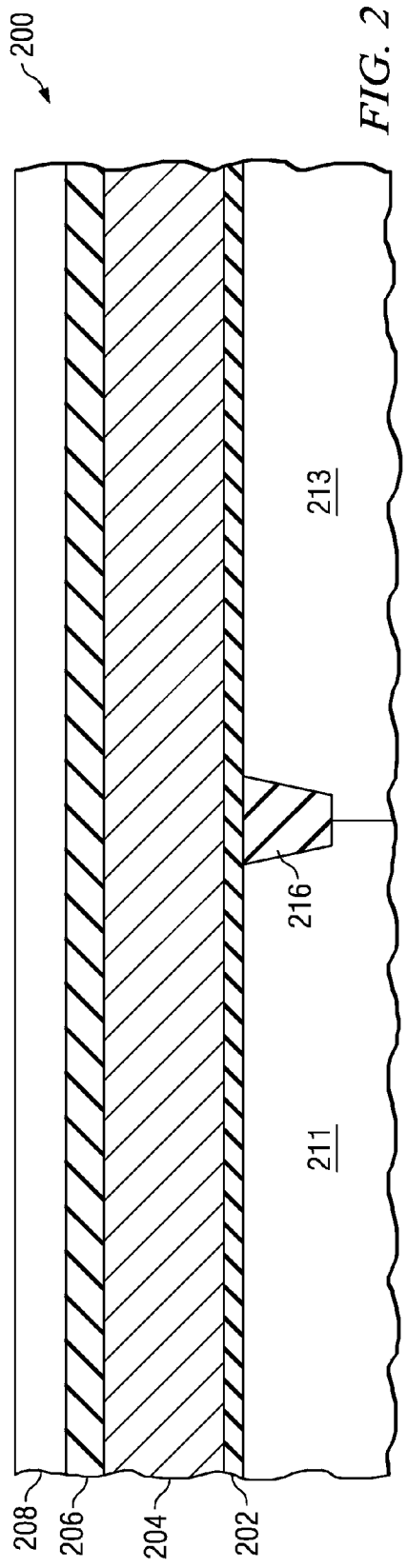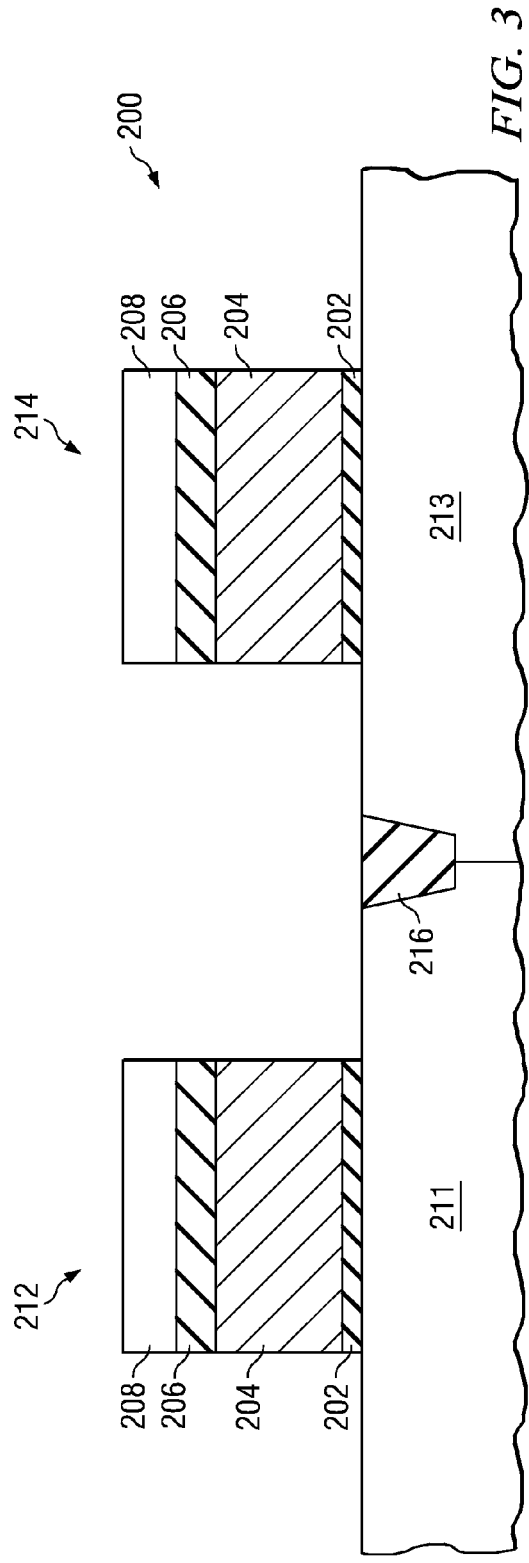

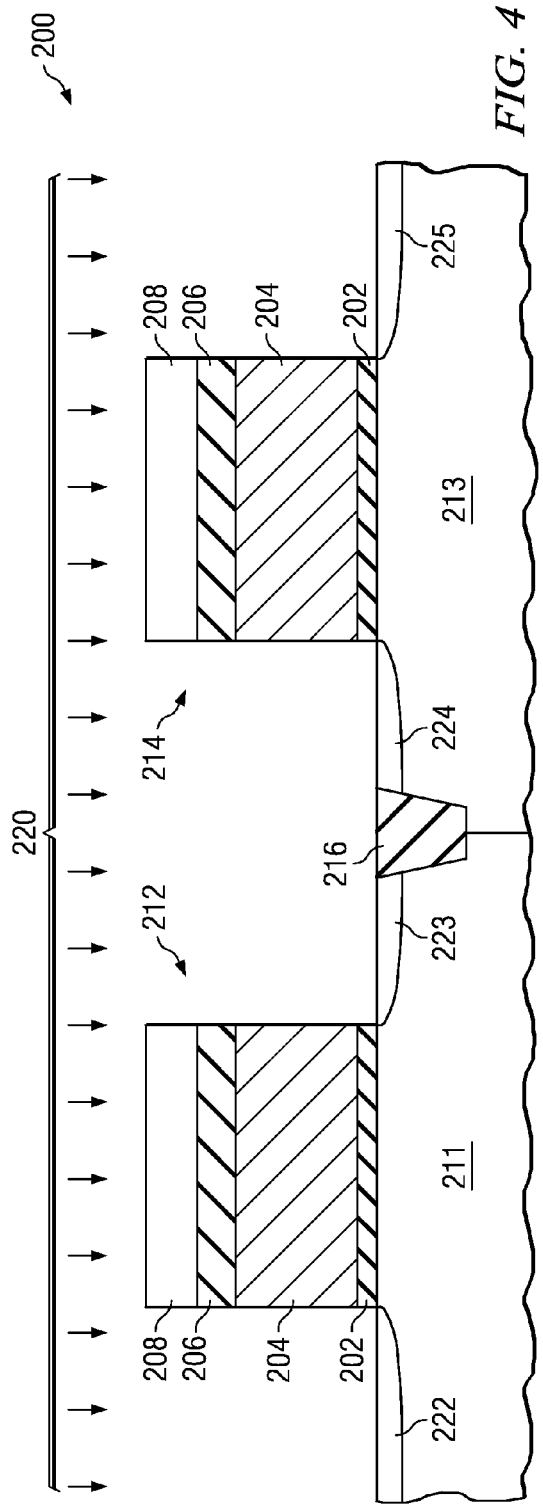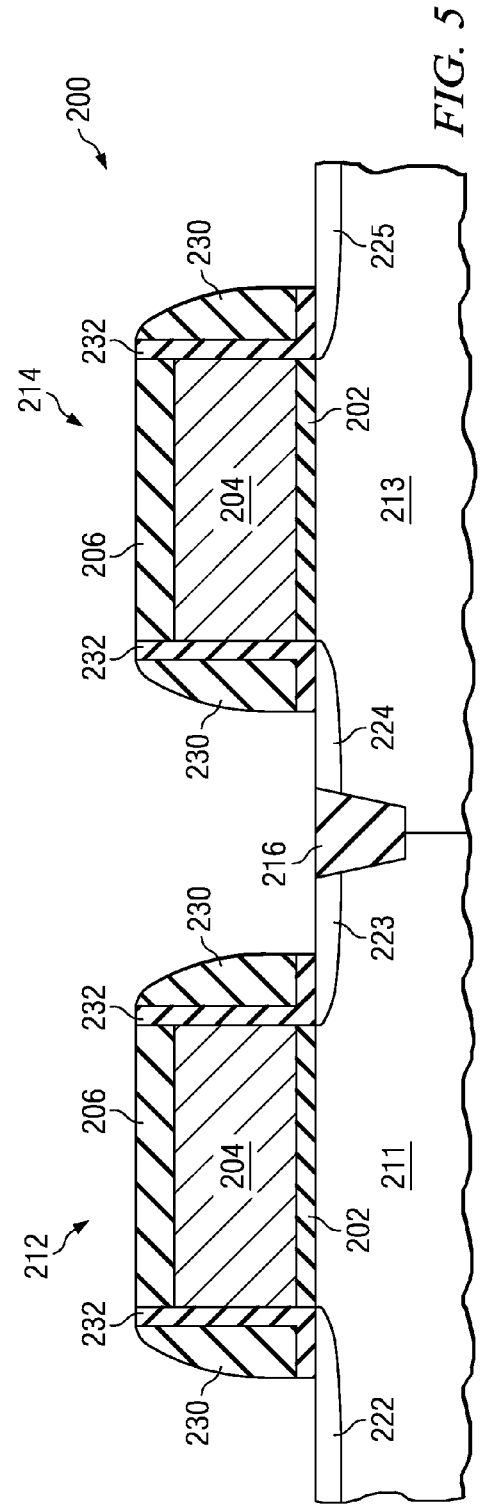

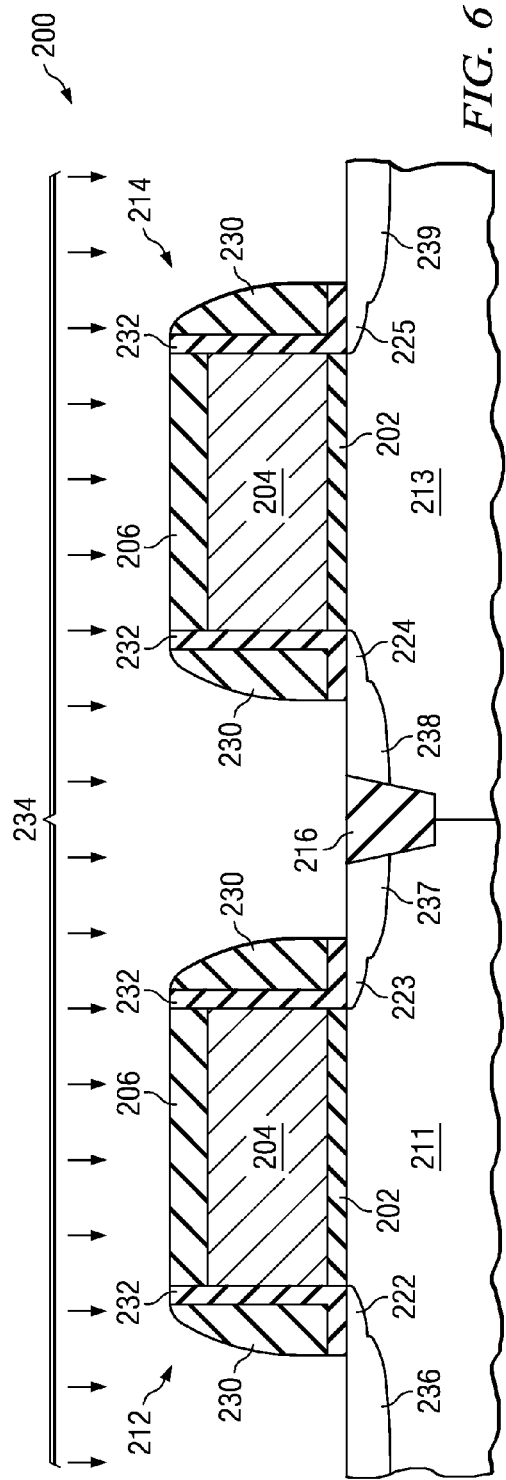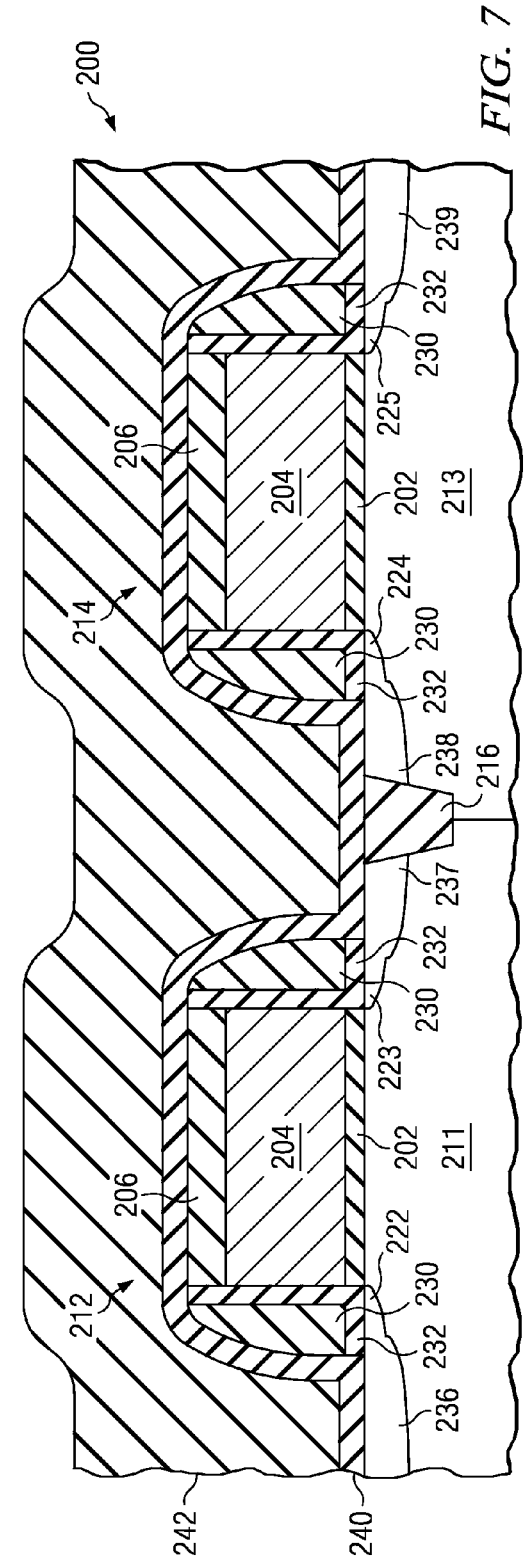

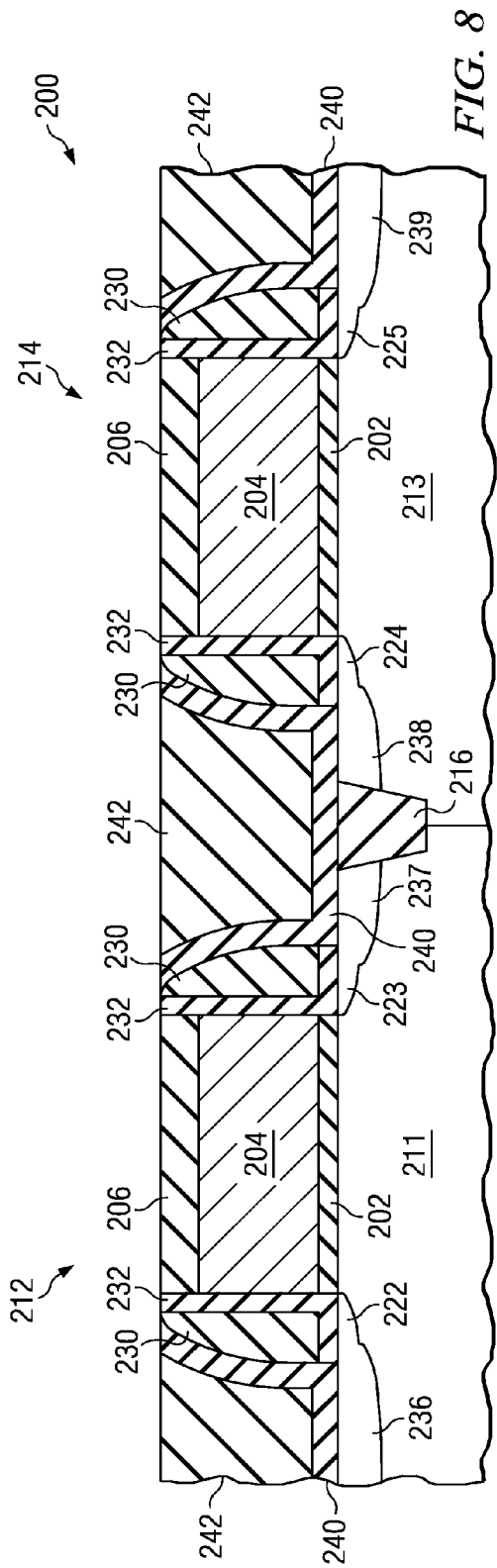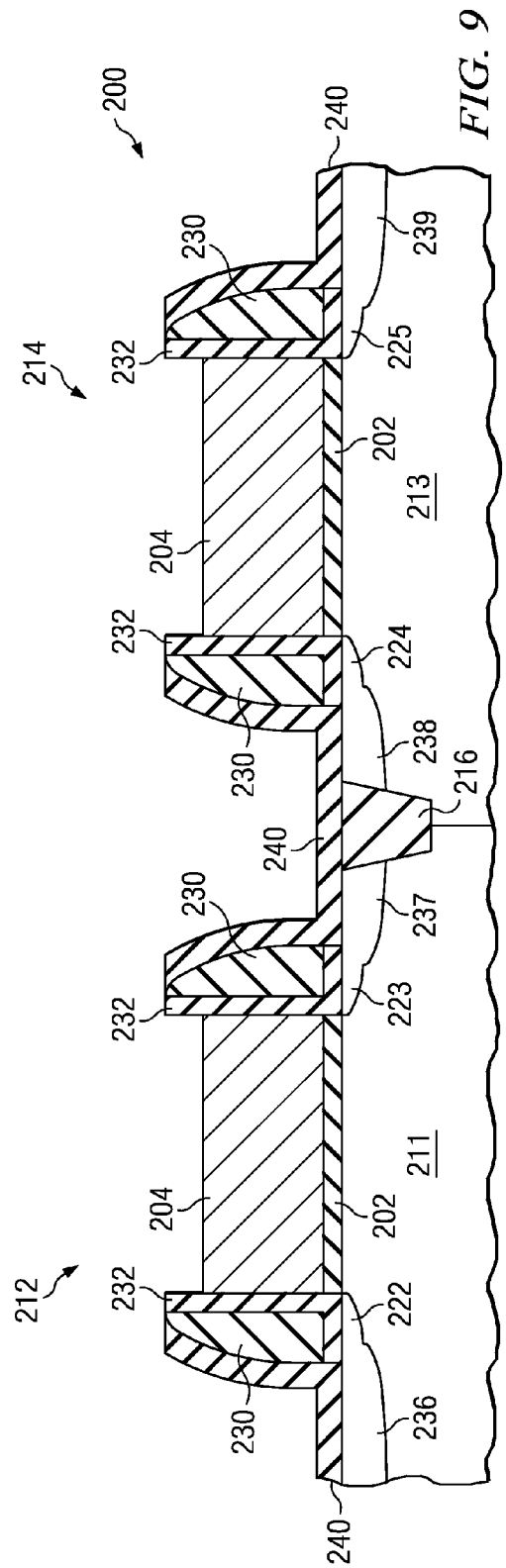

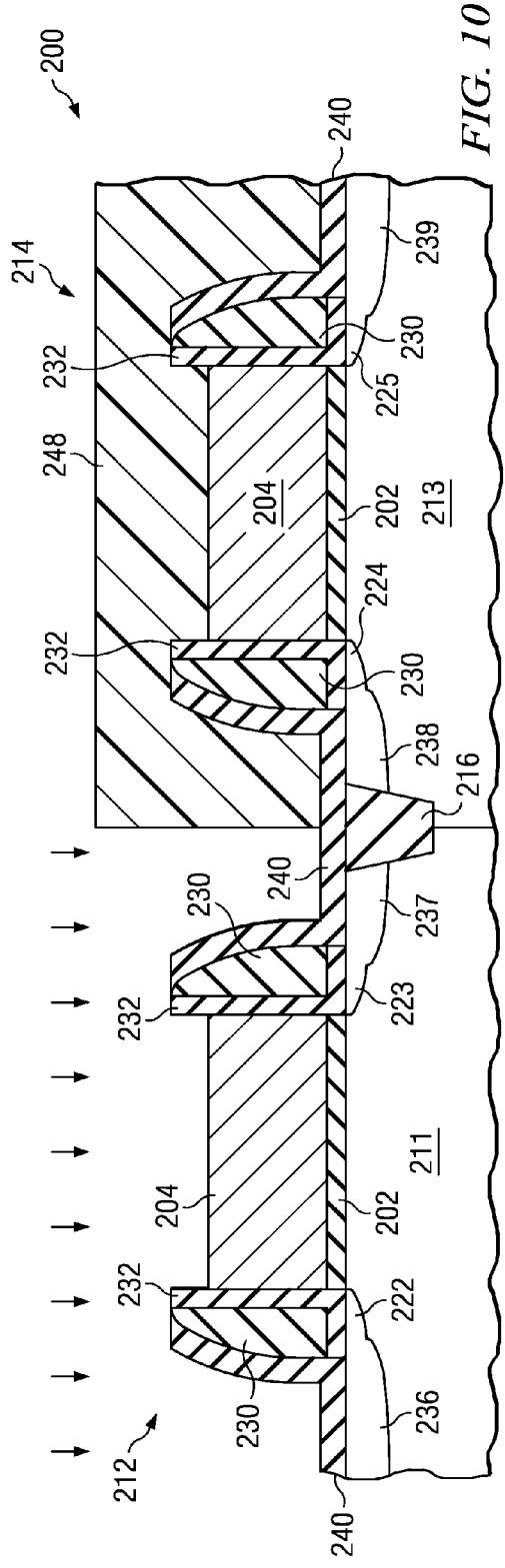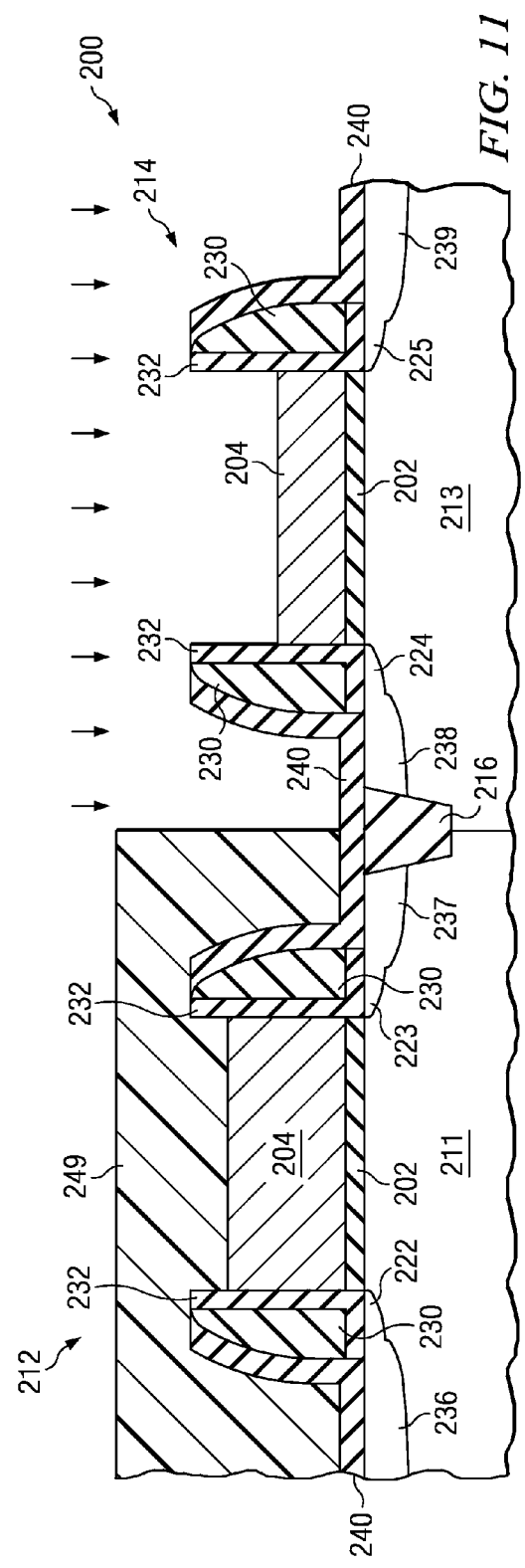

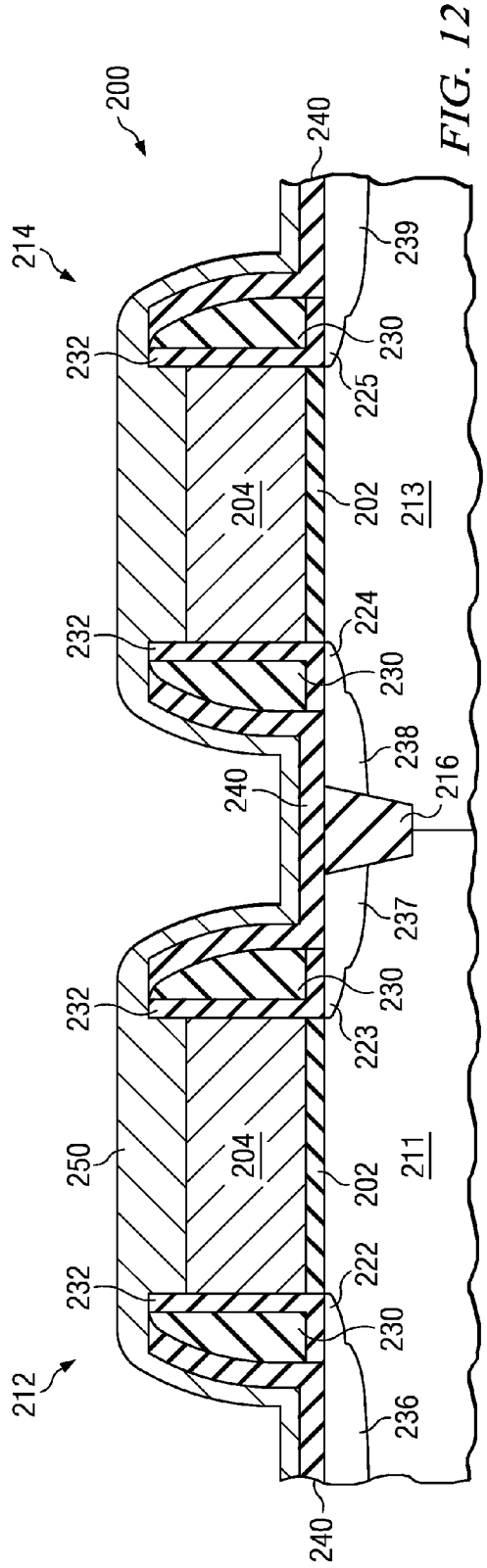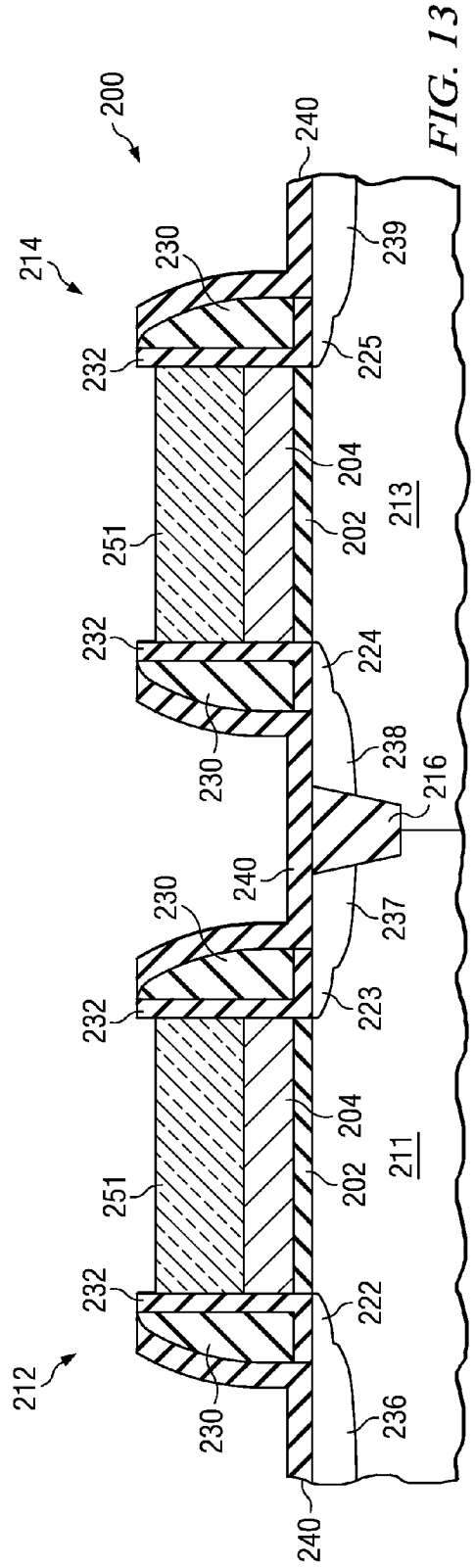

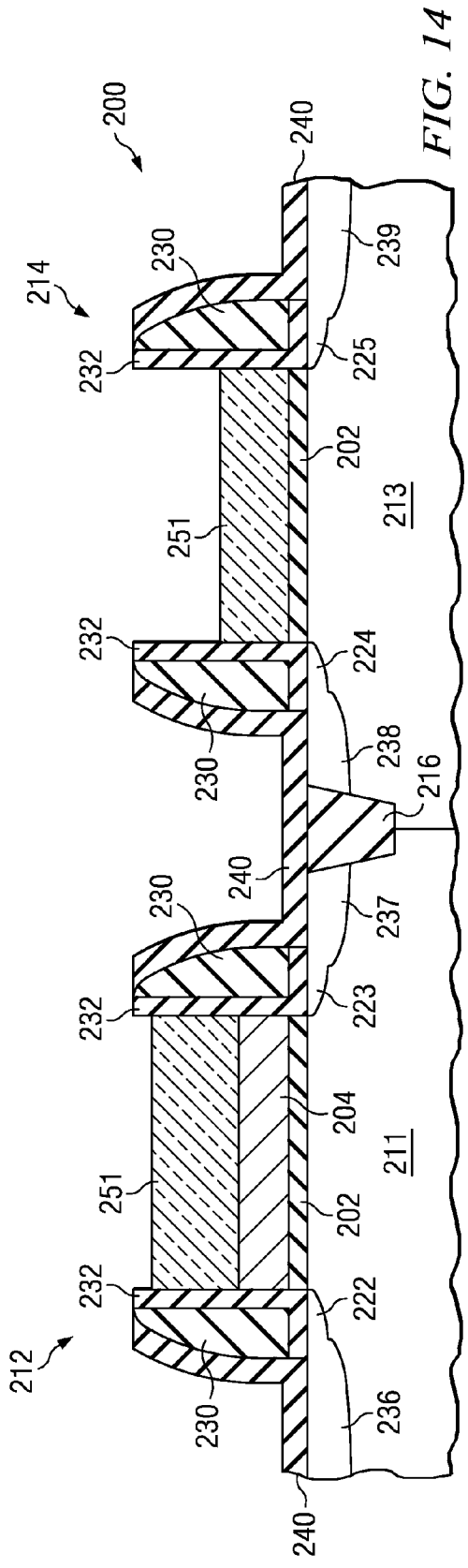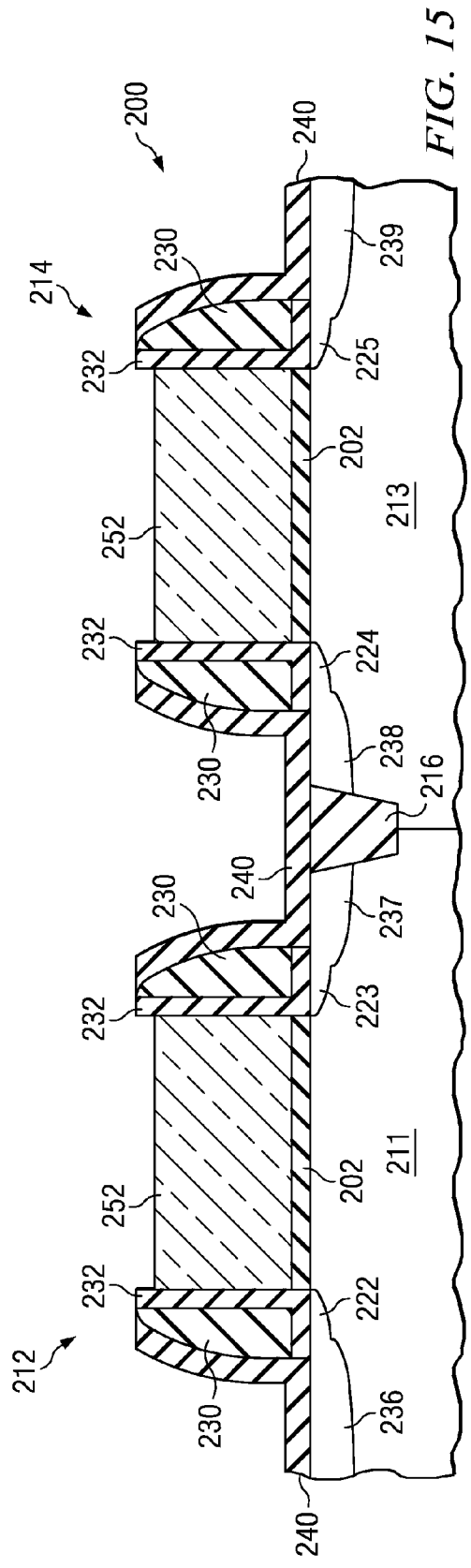

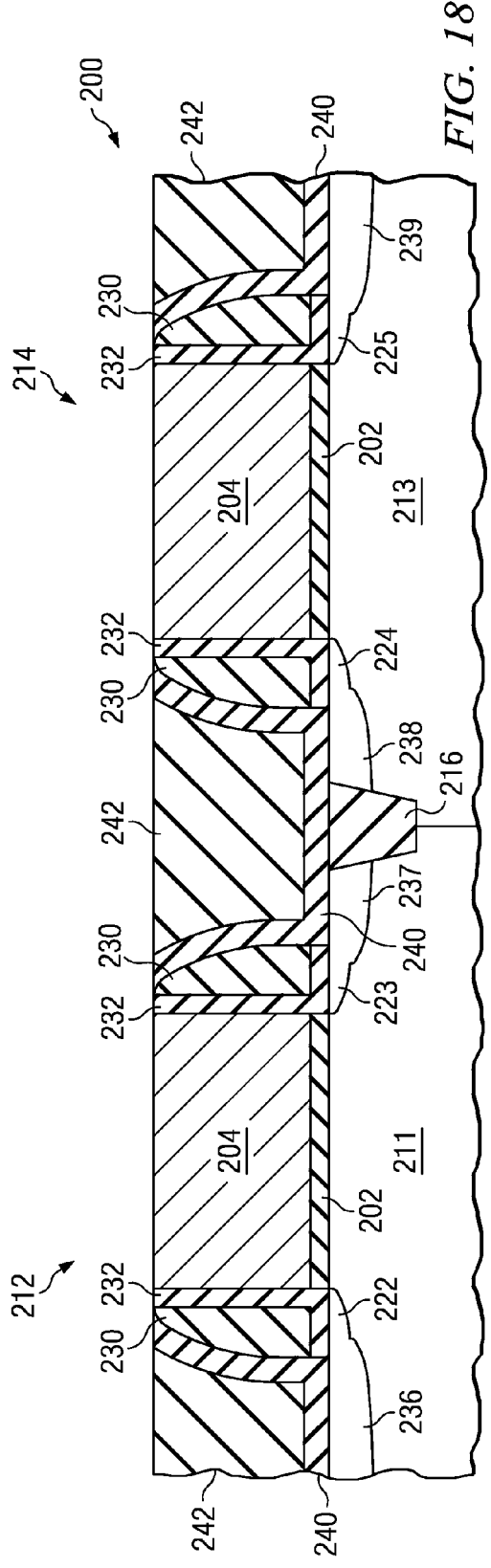
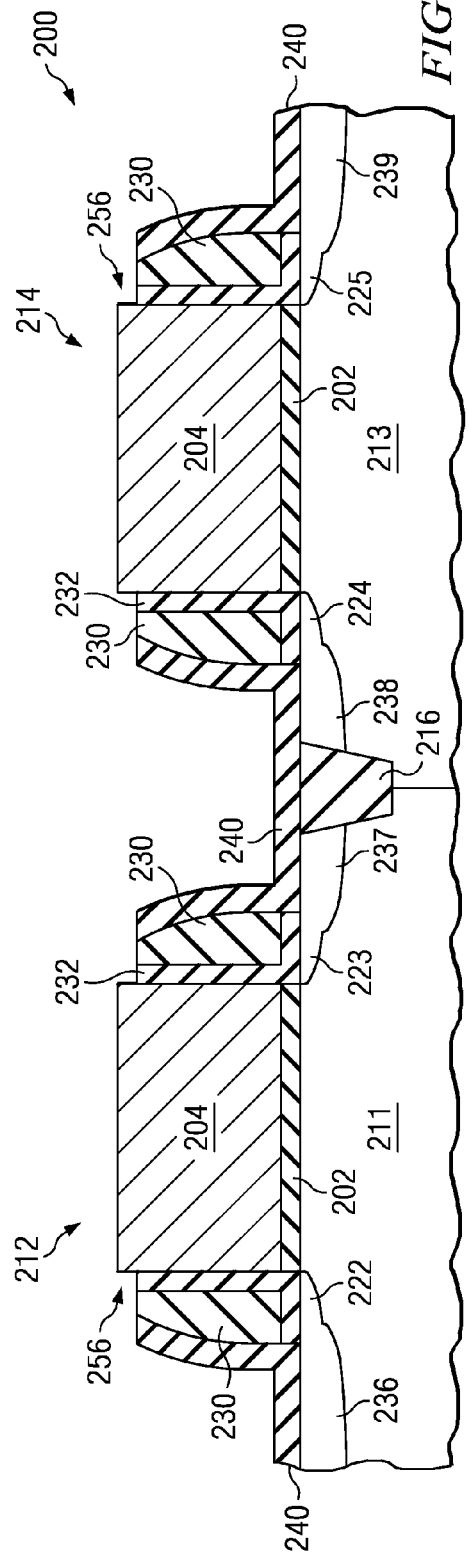

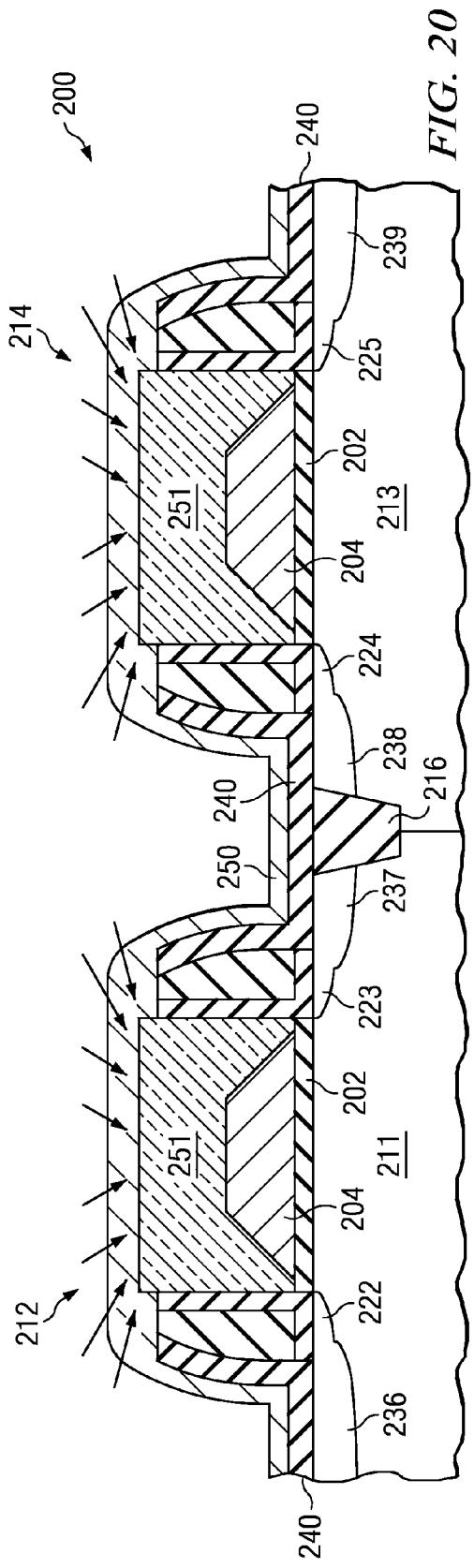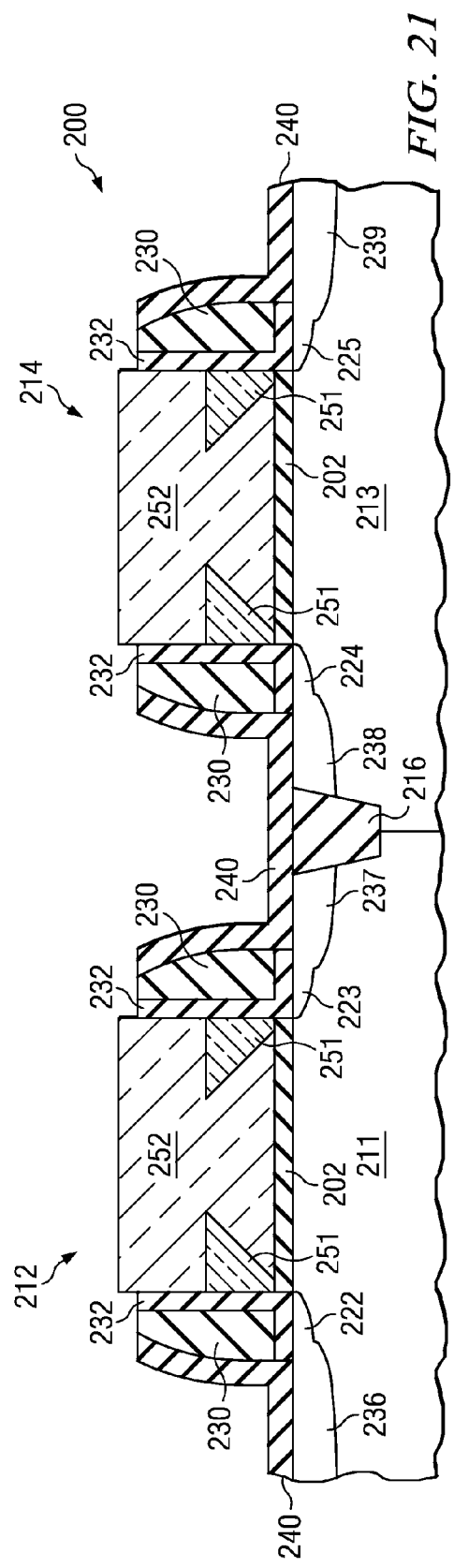

SACRIFICIAL CMP ETCH STOP LAYER

FIELD OF INVENTION

The present invention relates generally to semiconductor processing, and more particularly to implementing a sacrificial chemical mechanical polishing (CMP) stop layer in semiconductor fabrication.

BACKGROUND OF THE INVENTION

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there have been and continue to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges).

It can be appreciated that significant resources go into scaling down device dimensions and increasing packing densities. For example, significant man-hours may be required to design such scaled down devices, equipment necessary to produce such devices may be expensive and/or processes related to producing such devices may have to be very tightly controlled and/or be operated under very specific conditions, etc. Accordingly, it can be appreciated that there can be significant costs associated with exercising quality control over semiconductor fabrication, including, among other things, costs associated with discarding defective units, and thus wasting raw materials and/or man hours, as well as other resources, for example. Additionally, since the units are more tightly packed on the wafer, more units are lost when some or all of a wafer is defective and thus has to be discarded. Accordingly, techniques that mitigate yield loss (e.g., a reduction in the number of acceptable or usable units), among other things, would be desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

A chemical mechanical polishing (CMP) stop layer is implemented in a semiconductor fabrication process. The CMP stop layer, among other things, mitigates erosion of sidewall spacers during semiconductor fabrication and adverse effects associated therewith.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIGS. 2-16 are cross-sectional views of an example semiconductor substrate whereon semiconductor fabrication is performed and wherein a CMP stop layer is implemented as described herein.

FIGS. 17-22 are cross-sectional views of an example semiconductor substrate illustrating potential adverse effects experienced in the absence of a CMP stop layer as discussed herein.

DETAILED DESCRIPTION OF THE INVENTION

Figure 1:
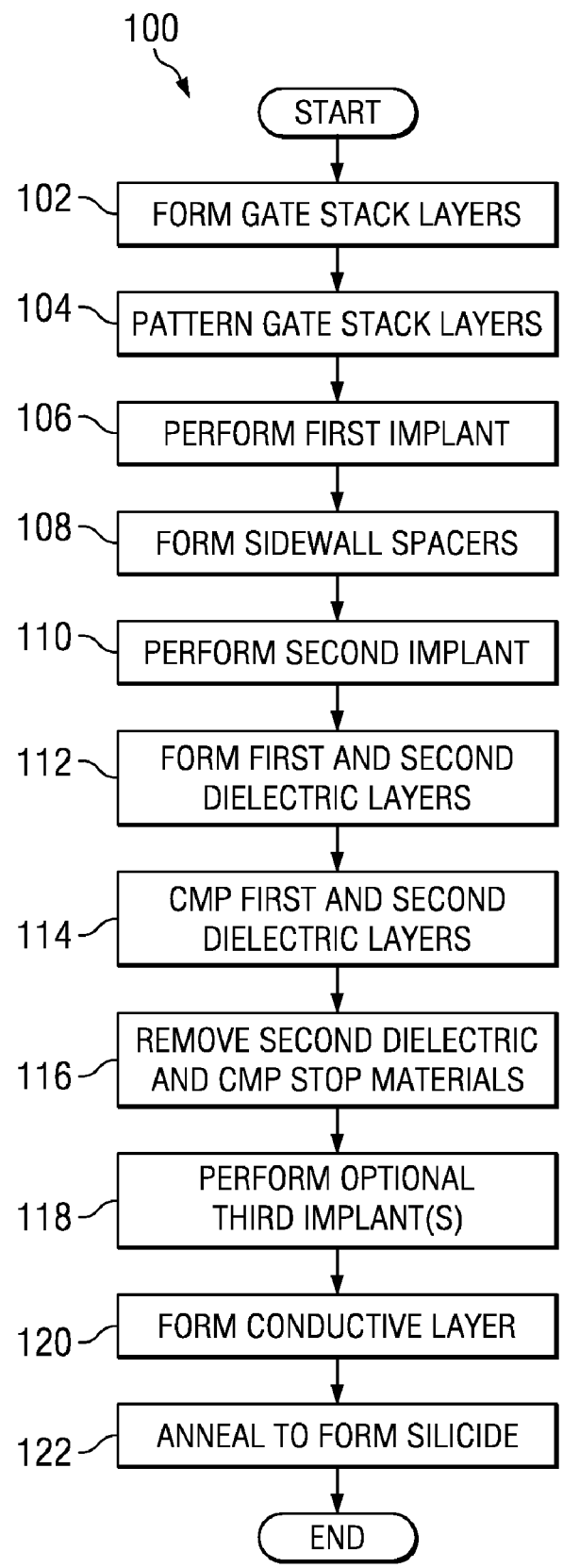
FIG. 1 is a flow diagram illustrating an example methodology for implementing a chemical mechanical polishing (CMP) stop layer in a semiconductor fabrication process as described herein.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding. It may be evident, however, to one skilled in the art, that one or more aspects described herein may be practiced with a lesser degree of these specific details. In other instances, known structures and devices are shown in block diagram form to facilitate a thorough understanding.

An example methodology 100 for implementing a chemical mechanical polishing (CMP) stop layer in a semiconductor fabrication process as described herein is illustrated in FIG. 1, and an example semiconductor substrate 200 where such a CMP stop layer is implemented is illustrated in cross-sectional view in FIGS. 2-16. While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At the outset, gate stack layers are formed over the semiconductor substrate 200 at 102 (FIG. 2). The gate stack layers comprise a relatively thin layer of gate dielectric material 202, a layer of gate electrode material 204, a layer of CMP stop material 206 and a layer of hardmask material 208. The layer of gate dielectric material 202 may comprise, for example, an oxide based material (e.g., $SiO_2$, nitrided $SiO_2$) and/or a high k material formed to a thickness of between about 10 Angstroms and about 50 Angstroms, for example. The layer of gate electrode material 204 may comprise, for example, a polysilicon and/or metal based material, for example, formed to a thickness of between about 500 Angstroms and about 1500 Angstroms, for example. The layer of CMP stop material 206 may comprise, for example, a SiGe (silicon-germanium) based material formed to a thickness of between about 100 Angstroms and about 500 Angstroms, for example. The layer of hardmask material 206 may comprise, for example, a nitride based material formed to a thickness of between about 200 Angstroms and about 500 Angstroms, for example.

The gate stack layers are then patterned at 104 (FIG. 3). In the illustrated example, two gate stacks 212, 214 are formed—one on either side of a dielectric material 216 formed in the substrate 200. The dielectric material 216 may comprise shallow trench isolation (STI) material, for example, that serves to electrically isolate the stacks (and semiconductor devices formed there-around) from one another. In one example, the left stack 212 may correspond to an NMOS device, for example, while the right stack 214 may correspond to a PMOS device. As such, the substrate under the respective devices may comprise dopants. For example, the area under the NMOS device 212 may comprise dopants to establish a PWELL 211, while the area under the PMOS device 214 may comprise dopants to establish an NWELL 213.

A first implantation 220 is performed at 106 to form source and drain extension regions in the substrate 200 on either side of the gate stacks 212, 214 (FIG. 4). It will be appreciated that this implantation may be referred to as a lightly doped drain (LDD). Additionally, where the gate stacks 212, 214 correspond to different transistors, respective LDD implantations may be performed for each of the transistors. Accordingly, the implantation 220 may actually comprise multiple implantations, where a dopant of arsenic, phosphorous, antimony and/or any other n type dopant may be implanted to form source 222 and drain 223 extension regions in the NMOS 212, and a dopant of boron, indium and/or any other p type dopant may be implanted to form source 224 and drain 225 extension regions in the PMOS device 214. It will be appreciated that a mask (not shown) and/or lithographic techniques may be used in directing dopant atoms into the select locations in the substrate 200 to form the source and drain extension regions 222, 223, 224, 225, where the PMOS 214 is masked off when the NMOS 212 is implanted and the NMOS 212 is masked off when the PMOS 214 is implanted.

It will also be appreciated that lithographic techniques may be implemented in any one or more of the acts described herein. Generally speaking lithography refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., doped).

The hardmask material 208 is removed (e.g., chemically stripped with hot $H_3PO_4$) from the gate stacks 212, 214, and sidewall spacers 230 are formed on the sides of the gate stacks 212, 214 at 108 (FIG. 5). In the illustrated example, the sidewall spacers 230 are formed over an optional thin layer of dielectric material 232 formed on the sides of the gate stacks 212, 214 and over the source and drain extension regions. The sidewall spacers 230 may comprise, for example, a nitride based material formed to a thickness of between about 100 Angstroms and about 550 Angstroms, for example. The liner dielectric material 232 may comprise, for example, an oxide based material formed to a thickness of between about 10 Angstroms and about 70 Angstroms, for example.

A second implant 234 is performed at 110 to form source and drain regions in the substrate 200 (FIG. 6). As with implant 220, implant 234 may comprise an implant of arsenic, phosphorous, antimony or other n type dopant (with the PMOS device 214 masked off) to form source 236 and drain 237 regions in the NMOS 212 device, and another implant of boron, indium or other p type dopant (with the NMOS device 212 masked off) to form source 238 and drain 239 regions in the PMOS 214 device. It will be appreciated that while the sidewall spacers 230 guide dopant atoms into select locations in the substrate 200 to form the source and drain regions 236, 237, 238, 239, one or more thermal processes may be performed to "activate" these dopant atoms causing them to migrate under the sidewall spacers 230 slightly, as illustrated in FIG. 6.

A first layer of dielectric material 240 is then formed over everything at 112, with a second layer of dielectric material 242 formed over the first layer of dielectric material 240 (FIG. 7). The first layer of dielectric material 240 may comprise, for example, a nitride based material (e.g., $Si_3N_4$) formed to a thickness of between about 150 Angstroms and about 350 Angstroms, for example. The second layer of dielectric material 242 may comprise, for example, an oxide based material (e.g., TEOS) formed to a thickness of between about 400 Angstroms and about 2000 Angstroms, for example. Since the first layer of dielectric material 240 precedes a metal deposition, it may be referred to as a pre-metal deposition (PMD) liner. Similarly, the second layer of dielectric material 242 may be referred to as PMD TEOS.

The second 242 and first 240 dielectric layers are then reduced via a chemical mechanical polishing (CMP) process at 114, with the CMP process stopping on and exposing the CMP stopping layer 206 (FIG. 8). It will be appreciated that removing the second 242 and first 240 dielectric layers with a (single) CMP process, among other things, allows step height issues to be resolved. Step height issues generally relate to non-uniformities experienced by and propagated up through layers. By way of example, isolating and other types of structures or features formed in the semiconductor substrate 200 (e.g., STI 216) may stick up above the surface of the substrate 200 slightly, creating an uneven surface. Such non-uniformities may be propagated up into layers formed over the features (and can be exacerbated as more and more layers are formed). Although not illustrated, it can be appreciated that such non-uniformities may be propagated up into the layers illustrated in FIG. 7. Accordingly, polishing the layers back to the CMP stopping layer 206 and continuing to polish until the upper surface of the CMP stopping layer 206 is planar allows such non-uniformities to be effectively polished away. The non-uniformities are thus not propagated into subsequently applied layers.

The second dielectric material 242 and the CMP stopping layer 206 are removed at 116 (FIG. 9). The second dielectric material 242 may be removed with HF, for example, while the CMP stopping layer 206 may be removed with NH₄OH:H₂O₂:H₂O, for example. An optional third implant is then performed at 116 to adjust respective work functions of one or more transistors. For example, should the stack 212 on the left correspond to an NMOS transistor and the stack 214 on the right correspond to a PMOS transistor, the PMOS stack 214 may be masked off with a resist 248 and a dopant of Yb, Gd, Er, Dy and/or other n type work function adjusting implants may be implanted into the gate electrode 204 to alter the work function of the NMOS transistor 212 (FIG. 10). Similarly, the NMOS stack 212 can be masked off with a resist 249 and a dopant of Al, Ga, Ru and/or other p type work function adjusting implants may be implanted into the gate electrode 204 to alter the work function of the PMOS transistor 214 (FIG. 11). It will thus be appreciated that where both NMOS and PMOS transistors receive work function altering dopants, the optional third implant may, in fact, comprise multiple implants. It will also be appreciated that the CMP stopping layer 206 allows the work function altering dopants to be more effective by deterring other dopants from entering the gate electrode layer 204. For example, in the absence of the CMP stopping layer 206, the source and drain extension region implants 220 performed at 106 (FIG. 4) and/or the source and drain implants 234 performed at 110 (FIG. 6) may be implanted into the gate electrode layer 204, where the presence of such dopants in the gate electrode layer 204 may make the work function dopants implanted at 116 less effective. By promoting the effectiveness of work function altering dopants, the CMP stopping layer 206 allows resulting semiconductor devices to be formed as desired, thereby mitigating yield loss.

Additionally, in the example illustrated in FIG. 11, the gate electrode material 204 has been reduced in the PMOS stack 214 so that it is thinner than the gate electrode material 204 in the NMOS stack 212. Such a reduction may take place, for example, after the CMP stopping layer 206 is removed at 116 (FIG. 9). For example, everything but the gate electrode 204 in the PMOS stack 214 (e.g., the NMOS stack 212 and the first layer of dielectric material 240, the sidewall spacers 230 and the dielectric liner 232 surrounding the PMOS stack 214) can be masked off and some of the gate electrode 204 in the PMOS stack 214 can be etched away. As will be appreciated this allows slightly different silicides to be formed in the PMOS 214 and NMOS 212 stacks, which may, at times, be desirable. Additionally, while FIG. 11 illustrates a work function implant being performed in the thinned gate electrode 204 of the PMOS stack 214, it will be appreciated that work function implants are generally not formed when the gate electrode 204 is thinned. Rather, such implants are more often performed when the gate electrode 204 is not thinned.

A layer of conductive material 250 (e.g., Ni) is formed (e.g., deposited) over everything at 120 (e.g., over the remaining aspects of the first layer of dielectric material 240 and the now exposed surface of the gate electrode material 204) (FIG. 12). A thermal process is then performed to form a silicide out of the conductive material 250 and the gate electrode 204 at 122. In particular, a first thermal process may be performed so that the conductive material 250 is driven down into the gate electrode 204 so that some, if not all, of the gate electrode comprises a first state silicide 251 (e.g., Ni₂Si, other nickel rich silicide) (FIG. 13). Such a first thermal process may be performed at a temperature of between about 300 degrees Celsius and about 450 degrees Celsius, for example, and for a duration of between about 30 seconds and about 120 seconds, for example. FIG. 14 illustrates the situation where the gate electrode 204 in the PMOS stack 214 is reduced or thinned. In this instance, substantially all of the gate electrode is comprised of the first state silicide 251 (e.g., Ni₂Si, other nickel rich silicide).

Figure 16:
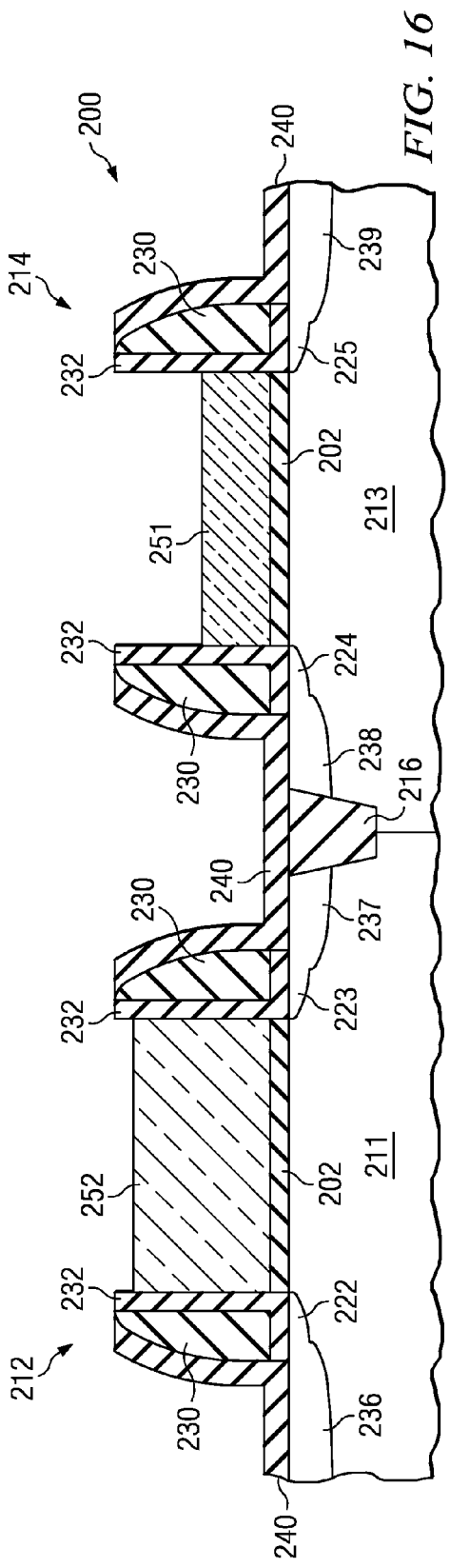

With the remaining un-reacted conductive material 250 removed (e.g., stripped), a second thermal process can be performed to form a second state silicide 252 (e.g., NiSi) (FIG. 15). Basically, the first state silicide 251 reacts with the remaining gate electrode material 204 during the second thermal process to form the second state silicide 252. Such a second thermal process may be performed at a temperature of between about 400 degrees Celsius and about 550 degrees Celsius, for example, and for a duration of between about 30 seconds and about 120 seconds, for example. FIG. 16 illustrates the situation where the PMOS stack 214 has been thinned (FIGS. 11, 14). Basically, since there is little to no gate electrode material 204 remaining in the PMOS stack 214 after the first thermal process when the gate electrode is thinned, little to no second state material 252 is formed in the PMOS stack 214 as a result of the second thermal process. Rather, the PMOS stack 214 continues to merely comprise (primarily) the first state silicide 251 after the second thermal process. The method ends thereafter, where one or more back end processing acts can subsequently be performed (e.g., to form and/or process one or more overlying conductive and/or non-conductive layers).

Figure 17:
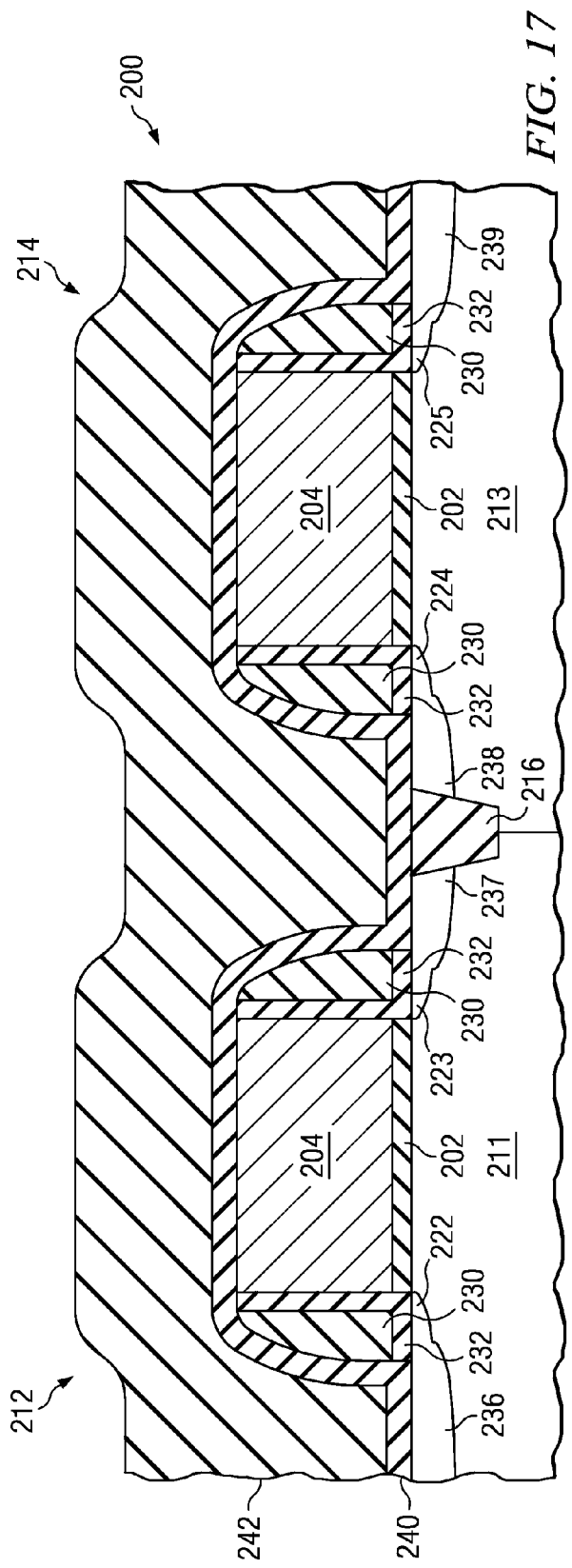

It will be appreciated that implementing the CMP stopping layer 206 as described herein, among other things, retards erosion of the sidewall spacers 230 and adverse effects associated therewith, thus mitigating yield loss. By way of example, FIG. 17 illustrates a point in a semiconductor fabrication process similar to that depicted in FIG. 7, but without the CMP stopping layer 206. In the absence of the CMP stopping layer 206, a single CMP process cannot be used to remove the second 242 and first 240 layers of dielectric material (FIG. 18) due to, among other things, fear of damaging the gate electrode material 204, for example. Accordingly, multiple etches may have to be performed to remove these layers in the absence of the CMP stopping layer 206. However, some of the liner dielectric material 232, sidewall spacers 230 and first layer of dielectric material 240 may be removed when multiple etchings are performed (FIG. 19). In this manner, an upper portion 256 of the gate electrode 204 may resultantly stick up above surrounding features. The protrusion of the gate electrode material 204 allows a higher concentration of the conductive material 250 to be driven down into the gate electrode 204. The distribution of a first state silicide 251 (e.g., Ni₂Si, other nickel rich silicide) relative to the gate electrode material 204 (e.g., after a first thermal treatment) may thus resemble that illustrated in FIG. 20. After reacting the first state silicide 251 with the remaining gate electrode material 204 (e.g., by a second thermal treatment), the distribution of resulting second state silicide 252 (e.g., NiSi) may resemble that illustrated in FIG. 21. It can be seen that there may be some first state silicide 251 remaining along the bottom sidewalls of the devices due to a lack of available gate electrode material 204. This may cause undesired operation of resulting devices, such as threshold voltage ($V_t$) instability, for example, which may necessitate discarding some fabricated units. Implementing the CMP stopping layer 206 as described herein inhibits the formation of such areas, thus mitigating yield loss.

Figure 22:
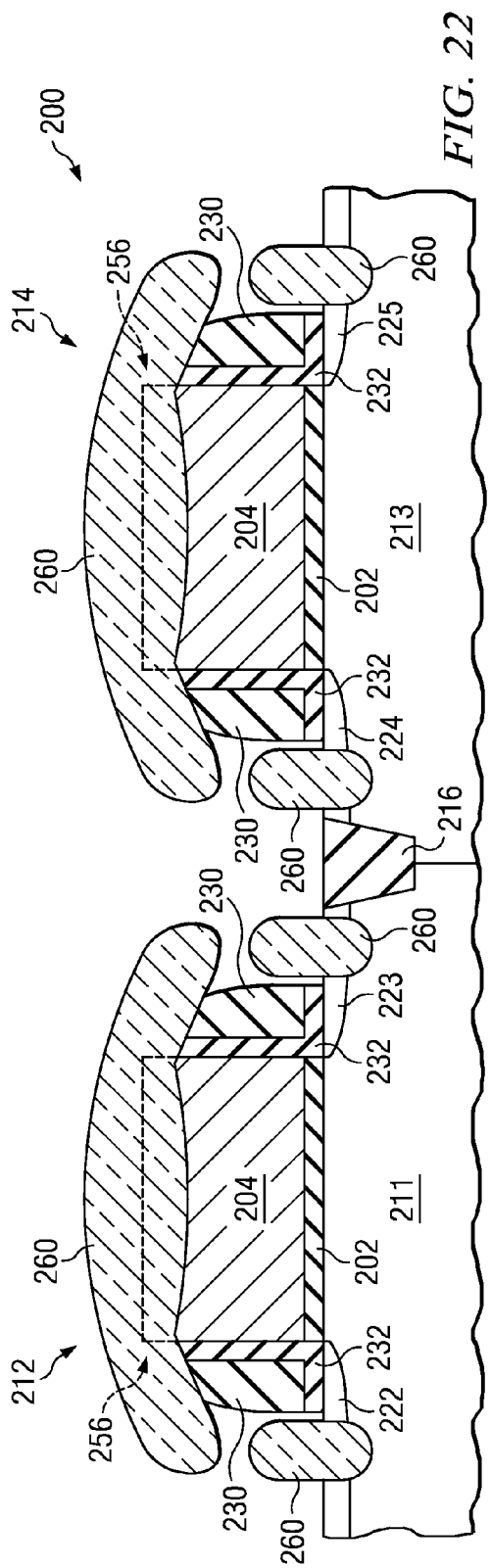

In addition to mitigating residual un-reacted gate electrode and conductive materials 204/250, implementing the CMP stopping layer 206 as described herein also mitigates yield loss by inhibiting shorting out of devices when conductive materials are used to instill a compressive strain within the devices. By way of example, FIG. 22 illustrates a situation where a CMP stopping layer 206 is not implemented as described herein. Accordingly, an upper portion 256 of the gate electrode 204 sticks up above surrounding features since some of the liner dielectric material 232, sidewall spacers 230 and first layer of dielectric material 240 (not shown) are removed due to multiple etches that are necessary in the absence if the CMP stopping layer 206 (as discussed above with regard to FIG. 19). When a straining material 260 (e.g., SiGe) is grown from or otherwise added to the conductive gate electrode 204 and the conductive source and drain regions, this conductive material 260 may "mushroom" over the liner dielectric material 232, sidewall spacers 230 and first layer of dielectric material 240 (not shown) and move down toward the source and drain regions, potentially shorting the gate electrode 204 to the source and/or drain regions.

Figure 23:
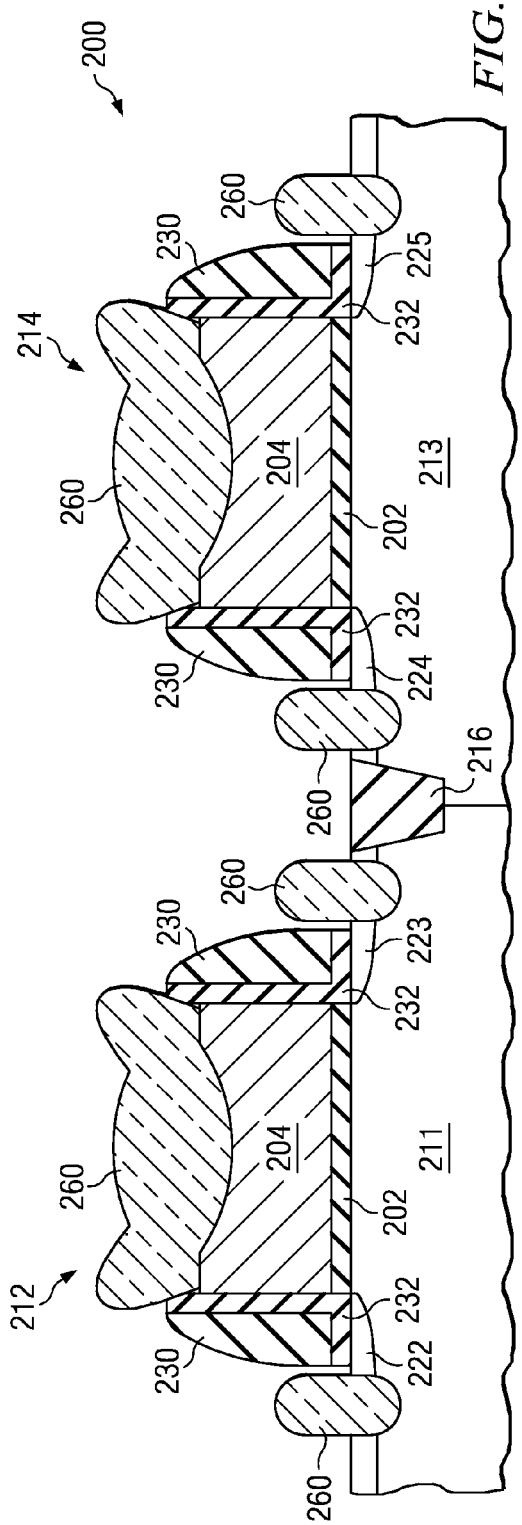
FIG. 23 is a cross-sectional view of an example semiconductor substrate illustrating mitigation of potential adverse effects when a CMP stop layer is implemented as discussed herein.

FIG. 23, on the other hand, illustrates a situation where a CMP stopping layer 206 is implemented as described herein so that the gate electrode 204 is surrounded by the liner dielectric material 232, sidewall spacers 230 and first layer of dielectric material 240 (not shown). Since the gate electrode 204 does not rise above these surrounding features, any conductive straining material 260 (e.g., SiGe) grown therefrom is substantially more contained by these features. Accordingly, the conductive straining material is less likely to mushroom over and short to the strained conductive source and drain regions, where such shorting adversely affects device performance. As such, implementing the CMP stopping layer 206 as described herein mitigates yield loss by inhibiting shorts between different parts of fabricated devices.

It will be appreciated that while layer 206 has been referred to herein as a CMP stop layer, that the layer is not meant to be limited to merely being resistive to CMP activity. For example, layer 206 may similarly be resistive to etching (as well as one or more other) processes, and thus is also be regarded as comprising an etch stop layer, for example. If the second 242 and first 240 dielectric layers were removed by one or more etching processes, for example, such processes would effectively "stop" on layer 206. In this manner, some, if not all, of the benefits described above with layer 206 serving as a CMP stopping layer would also be enjoyed if layer 206 serves as an etch stopping layer. For example, the surrounding features (e.g., sidewall spacers 230, etc.) would be substantially preserved so that an upper portion 256 of the gate electrode 204 does not stick up above said features.

It will be appreciated that substrate or semiconductor substrate as used herein may comprise any type of semiconductor body (e.g., silicon, SiGe, SOI) such as a semiconductor wafer or one or more die on a wafer, as well as any other type of semiconductor and/or epitaxial layers associated therewith. Also, while reference is made throughout this document to exemplary structures in discussing aspects of methodologies described herein (e.g., those structures presented in FIGS. 2-16 while discussing the methodology set forth in FIG. 1), those methodologies are not to be limited by the corresponding structures presented. Rather, the methodologies (and structures) are to be considered independent of one another and able to stand alone and be practiced without regard to any of the particular aspects depicted in the drawings. Additionally, layers described herein can be formed in any suitable manner, such as with spin on, sputtering, growth and/or deposition techniques, etc.

Although the disclosure herein has been shown and described with respect to one or more implementations, equivalent alterations and modifications will occur to others skilled in the art based upon a reading and understanding of this specification and the annexed drawings. The disclosure herein includes all such modifications and alterations and is limited only by the scope of the following claims. In addition, while a particular feature or aspect may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of forming a semiconductor device, comprising:
    forming a gate stack over a semiconductor substrate, the gate stack having a height and including a layer of gate dielectric material formed over the substrate, a layer of gate electrode material including polysilicon formed over the layer of gate dielectric material, and a layer of silicon-germanium (SiGe) material formed over and in direct contact with the layer of gate electrode material;
    forming a layer of first dielectric material over the gate stack and over regions of the substrate adjacent to the gate stack;
    forming a layer of second dielectric material over the layer of first dielectric material, the layers of first and second dielectric materials having a combined thickness greater than the height of the gate stack;
    performing a chemical mechanical polishing (CMP) process to planarize the layers of first and second dielectric materials down to expose the layer of silicon-germanium material;
    following the chemical mechanical polishing (CMP) process, selectively chemically etching the layer of silicon-germanium material using an etchant to expose the polysilicon;
    following the chemically etching, forming a blanket layer of siliciding material over the planarized layers of first and second dielectric materials and over the exposed polysilicon; and
    reacting the siliciding material with the polysilicon to form a silicide.

2. The method of claim 1, wherein one of the first and second dielectric materials comprising a nitride; the other of the first and second dielectric materials comprises an oxide; and the etchant is a wet etchant selective to the polysilicon and to the nitride and the oxide.

3. The method of claim 2, wherein the etchant comprises an ammonia hydrogen peroxide solution ($NH_4OH:H_2O_2:H_2O$).

4. The method of claim 2, wherein the nitride comprises silicon nitride and the oxide comprises tetraethyl orthosilicate (TEOS).

5. The method of claim 1, wherein the gate stack further includes a nitride hardmask formed over the layer of silicon-germanium material, and the nitride hardmask is removed prior to forming the layer of first dielectric material.

6. The method of claim 5, further comprising forming sidewall spacers on sides of the gate stack, and implanting dopant to form source/drain regions in the substrate adjacent the sidewall spacers; and wherein the layer of first dielectric material is formed over the source/drain regions.

7. The method of claim 6, further comprising forming source/drain extension regions in the substrate.

8. The method of claim 6, wherein the etchant is selective to the polysilicon and to material of the sidewall spacers.

9. The method of claim 1, wherein the layer of gate dielectric material is formed to a thickness of between about 10 and about 50 Angstroms; the layer of gate electrode material is formed to a thickness of between about 500 and about 1500 Angstroms; and the layer of silicon-germanium is formed to a thickness of between about 100 and about 500 Angstroms.

10. The method of claim 9, wherein the layer of first dielectric material is formed to a thickness of between about 150 and about 350 Angstroms; and the layer of second dielectric material is formed to a thickness of between about 400 and about 2000 Angstroms.

11. The method of claim 10, wherein the gate stack further includes a layer of hardmask material formed over the layer of silicon-germanium material to a thickness of between about 200 and about 500 Angstroms.

12. The method of claim 11, wherein the first dielectric material comprises a nitride, the second dielectric material comprises an oxide, the hardmask material comprises a nitride, and the etchant comprises an ammonia hydrogen peroxide solution ($NH_4OH:H_2O_2:H_2O$).

13. The method of claim 1, wherein reacting the siliciding material comprises performing a first thermal process to partially silicide the polysilicon; removing unreacted portions of the siliciding material after performing the first thermal process; and performing a second thermal process to fully silicide the polysilicon after removing the unreacted portions.

14. The method of claim 1, wherein the siliciding material comprises nickel (Ni); and reacting the siliciding material comprises performing a first thermal process at a temperature of between about 300° C. and about 450° C. to form a first state nickel silicide, removing unreacted portions of the nickel following the first thermal process, and performing a second thermal process at a temperature of between about 400° C. and about 550° C. to form a second state nickel silicide after removing the unreacted portions.

15. The method of claim 1, wherein the layer of gate electrode material is formed to be at least three times thicker than the layer of silicon-germanium.

16. A method of forming a semiconductor device, comprising:
    forming a gate stack over a semiconductor substrate, the gate stack having a height and including a layer of gate dielectric material formed over the substrate, a layer of gate electrode material including polysilicon formed over the layer of gate dielectric material, a layer of silicon-germanium (SiGe) material formed over and in direct contact with the layer of gate electrode material, and a layer of hardmask material formed over the layer of silicon-germanium material;
    forming sidewall spacers on sides of the gate stack;
    implanting dopant to form source/drain regions in the substrate adjacent the sidewall spacers;
    forming a layer of nitride dielectric material over the gate stack and over the source/drain regions;
    forming a layer of oxide dielectric material over the layer of nitride dielectric material, the layers of nitride and oxide dielectric materials having a combined thickness greater than the height of the gate stack;
    performing a chemical mechanical polishing (CMP) process to planarize the layers of nitride and oxide dielectric materials down to expose the layer of silicon-germanium material;
    following the chemical mechanical polishing (CMP) process, selectively chemically wet etching the layer of silicon-germanium material using an etchant selective to polysilicon, to the nitride dielectric material and to the oxide dielectric material to expose the polysilicon;
    following the wet etching, forming a blanket layer of siliciding metal over the planarized layers of nitride and oxide dielectric materials and over the exposed polysilicon; and
    reacting the siliciding metal with the polysilicon to form a metal silicide.

17. The method of claim 16, wherein the nitride comprises silicon nitride, the oxide comprises tetraethyl orthosilicate (TEOS), and the etchant comprises an ammonia hydrogen peroxide solution ($NH_4OH:H_2O_2:H_2O$).

18. The method of claim 17, wherein the sidewalls comprise a first layer of an oxide material and a second layer of a nitride material.

19. The method of claim 16, wherein the layer of hardmask material comprises a nitride hardmask material; and the nitride hardmask material is removed prior to forming the layer of nitride dielectric material.

20. The method of claim 16, wherein the layer of gate electrode material is formed to be three to five times thicker than the layer of silicon-germanium.

21. The method of claim 16, wherein reacting the siliciding metal comprises performing a first thermal process to partially silicide the polysilicon; removing unreacted portions of the siliciding metal after the first thermal process; and performing a second thermal process to fully silicide the polysilicon after removing the unreacted portions.

22. The method of claim 21, wherein the siliciding metal comprises nickel (Ni).

23. A method of forming a semiconductor device, comprising:
    forming a gate stack over a semiconductor substrate, including a layer of gate dielectric material including at least one of silicon oxide or a high-k dielectric material formed over the substrate, a layer of gate electrode material including polysilicon formed over the layer of gate dielectric material, a layer of silicon-germanium (SiGe) material formed over and in direct contact with the layer of gate electrode material, and a layer of nitride hardmask material formed over the layer of silicon-germanium material; the gate stack having a height and the layer of gate electrode material being at least three times thicker than the layer of silicon-germanium;
    forming sidewall spacers on sides of the gate stack;
    implanting dopant to form source/drain regions in the substrate adjacent the sidewall spacers;
    removing the layer of nitride hardmask material;
    forming a layer of nitride dielectric material comprising silicon nitride over the gate stack and over the source/drain regions;
    forming a layer of oxide dielectric material comprising tetraethyl orthosilicate (TEOS) over the layer of nitride dielectric material, the layers of nitride and oxide dielectric materials having a combined thickness greater than the height of the gate stack;
    performing a single chemical mechanical polishing (CMP) process to planarize the layers of nitride and oxide dielectric materials down to expose the layer of silicon-germanium material;

following the chemical mechanical polishing (CMP) process, selectively chemically wet etching the layer of silicon-germanium material using an etchant comprising an ammonia hydrogen peroxide solution ($NH_4OH$:$H_2O_2$:$H_2O$) to expose the polysilicon;

following the chemically wet etching, forming a blanket layer of siliciding metal over the planarized layers of nitride and oxide dielectric materials and over the exposed polysilicon; and thermally reacting the siliciding metal with the polysilicon to form a metal silicide.

24. The method of claim 23 wherein the sidewalls comprise layers of oxide and nitride materials.

25. The method of claim 24, wherein the layer of gate dielectric material is formed to a thickness of between about 10 and about 50 Angstroms; the layer of gate electrode material is formed to a thickness of between about 500 and about 1500 Angstroms; the layer of silicon-germanium is formed to a thickness of between about 100 and about 500 Angstroms; the layer of hardmask material is formed to a thickness of between about 200 and about 500 Angstroms; the layer of nitride dielectric material is formed to a thickness of between about 150 and about 350 Angstroms; and the layer of oxide dielectric material is formed to a thickness of between about 400 and about 2000 Angstroms.

26. The method of claim 25, wherein the siliciding metal comprises nickel (Ni); and reacting the siliciding metal comprises performing a first thermal process at a temperature of between about 300° C. and about 450° C. to form a first state nickel silicide, removing unreacted portions of the nickel following the first thermal process, and performing a second thermal process at a temperature of between about 400° C. and about 550° C. to form a second state nickel silicide after removing the unreacted portions.

* * * * *